(12) United States Patent
Kim et al.

(10) Patent No.: US 7,317,469 B2
(45) Date of Patent: Jan. 8, 2008

(54) LASER INDUCED THERMAL IMAGING APPARATUS

(75) Inventors: Mu-Hyun Kim, Suwon-si (KR); Byung-Doo Chin, Seongnam-si (KR); Myung-Won Song, Suwon-si (KR); Seong-Taek Lee, Suwon-si (KR)

(73) Assignee: Samsung SDI Co., Ltd., Suwon (KR)

( * ) Notice: Subject to any disclaimer, the term of this patent is extended or adjusted under 35 U.S.C. 154(b) by 203 days.

(21) Appl. No.: 11/020,657

(22) Filed: Dec. 27, 2004

(65) Prior Publication Data
US 2006/0044387 A1    Mar. 2, 2006

(30) Foreign Application Priority Data
Aug. 30, 2004 (KR) .............. 10-2004-0068758

(51) Int. Cl.
*B41J 2/435* (2006.01)
(52) U.S. Cl. ..................... 347/224; 430/200
(58) Field of Classification Search ........ 347/171, 347/224, 262, 264; 430/200, 201
See application file for complete search history.

(56) References Cited
U.S. PATENT DOCUMENTS

| | | | |
|---|---|---|---|
| 5,910,813 A | 6/1999 | Fassler et al. | |
| 6,555,284 B1 * | 4/2003 | Boroson et al. | 430/201 |
| 6,566,032 B1 | 5/2003 | Boroson et al. | |
| 6,610,455 B1 * | 8/2003 | Burberry et al. | 430/200 |
| 6,695,029 B2 * | 2/2004 | Phillips et al. | 156/540 |
| 6,695,030 B1 * | 2/2004 | Phillips et al. | 156/540 |
| 2002/0098614 A1 | 7/2002 | Akai | |
| 2002/0135664 A1 | 9/2002 | Mashimo et al. | |
| 2004/0046858 A1 | 3/2004 | Yoshinari | |
| 2004/0206307 A1 | 10/2004 | Boroson et al. | |

FOREIGN PATENT DOCUMENTS

| | | |
|---|---|---|
| KR | 1020030065371 | 8/2003 |
| KR | 1020040017787 | 2/2004 |

* cited by examiner

*Primary Examiner*—Huan Tran
(74) *Attorney, Agent, or Firm*—H.C. Park & Associates, PLC

(57) ABSTRACT

A laser induced thermal imaging apparatus for fabricating an organic light emitting display is provided. The laser induced thermal imaging apparatus includes a stage where a substrate is positioned; a transport device for transporting a donor substrate; a laminator for laminating the substrate to the donor substrate; a laser optical unit for performing the LITI, and a chamber supplied with an atmospheric pressure of an inert gas in which the stage, the laminator, and the laser optical unit are positioned.

17 Claims, 4 Drawing Sheets

LASER INDUCED THERMAL IMAGING APPARATUS

CROSS-REFERENCE TO RELATED APPLICATION

This application claims priority to and the benefit of Korean Patent Application No. 2004-68758, filed Aug. 30, 2004, the disclosure of which is incorporated herein by reference in its entirety.

BACKGROUND OF THE INVENTION

1. Field of the Invention

The present invention relates to a laser induced thermal imaging apparatus and, more particularly, to a laser induced thermal imaging apparatus for fabricating an organic light emitting display.

2. Description of the Related Art

In general, an organic light emitting display (OLED) among flat panel displays has a fast response speed of 1 ms or less, low power consumption, and is an emissive display, so that it does not have a view angle problem and may be advantageously employed as a display medium for displaying moving pictures in regardless of its size. In addition, it may be fabricated at a low temperature and a process for fabricating the same based on the conventional semiconductor process technique is simple, so that it has been noticed as a next-generation flat panel display.

The OLED may be mainly classified into a polymer type display using a wet process and a small molecular type display using a deposition process according to a material and a process employed for an organic light emitting diode.

In the case of inkjet printing method among methods of patterning a polymer or small molecular emission layer, there exists a limit in employing the material for organic layers except the emission layer and a trouble in forming a structure for inkjet printing on a substrate. In addition, in the case of pattering the emission layer by means of a deposition process, there occurs a difficulty in fabricating a large-sized device due to a use of a metal mask.

Accordingly, a laser induced thermal imaging (LITI) method has been developed in recent years which may be employed instead of the above-described pattering methods.

The LITI method is one that converts laser generated from a light source into thermal energy, which allows a material of forming a pattern to be transferred onto a target substrate to form the pattern, and in order to perform such a method, a donor substrate where the transfer layer is formed, a light source, and a subject substrate are required. In accordance with the LITI method, the donor substrate covers the substrate being an acceptor, and the donor substrate and the substrate are fixed on a stage.

In general, the transfer layer is an organic layer which is very sensitive to oxygen and vapor. That is, when the organic layer is exposed to the oxygen or the vapor, lifetime of the organic layer is degraded, or luminous efficiency and lifetime are degraded when the organic layer includes an emission layer. The lifetime and the luminous efficiency of the organic light emitting display may be adversely affected, so that it is essential to consider an atmosphere within an apparatus where the transfer procedure is carried out.

SUMMARY OF THE INVENTION

The present invention, therefore, solves aforementioned problems associated with conventional devices by providing an LITI apparatus of enhancing lifetime and luminous efficiency of the organic light emitting display by making the LITI apparatus in an atmospheric pressure of an inert gas.

The present invention also solves aforementioned problems associated with conventional devices by providing an LITI apparatus capable of performing lamination, and transfer of red (R), green (G), and blue (B) emission layers in one apparatus.

In an exemplary embodiment according to the present invention, an LITI apparatus includes: a stage where a substrate is positioned; a transport device for transporting a donor substrate; a laminator for laminating the substrate with the donor substrate; a laser optical unit for performing the LITI; and a chamber supplied with an atmospheric pressure of an inert gas in which the stage, the laminator, and the laser optical unit are positioned.

The atmospheric pressure of the inert gas may contain a water vapor concentration of 10 ppm or less.

The atmospheric pressure of the inert gas may contain an oxygen concentration of 10 ppm or less.

The stage where the substrate is transported, and the donor substrate transport device may be moved in directions different from each other.

The donor substrate transport device may be positioned to be discriminated in response to each color of the emission layer.

In another exemplary embodiment according to the present invention, an LITI apparatus includes: a stage where a substrate is positioned, and movable in a constant direction; a transport device for transporting a donor substrate moving toward the stage in a direction different from that of the stage, and being positioned to be discriminated in response to each color of an emission layer; a laminator for laminating the substrate to the donor substrate used for the LITI; and a laser optical unit for performing the LITI.

Each of the donor substrate transport devices may be moved in a deposition device connected outside the LITI apparatus.

BRIEF DESCRIPTION OF THE DRAWINGS

The above and other features of the present invention will be described in reference to certain exemplary embodiments thereof with reference to the attached drawings in which.

DETAILED DESCRIPTION OF THE INVENTION

Figure 1A:
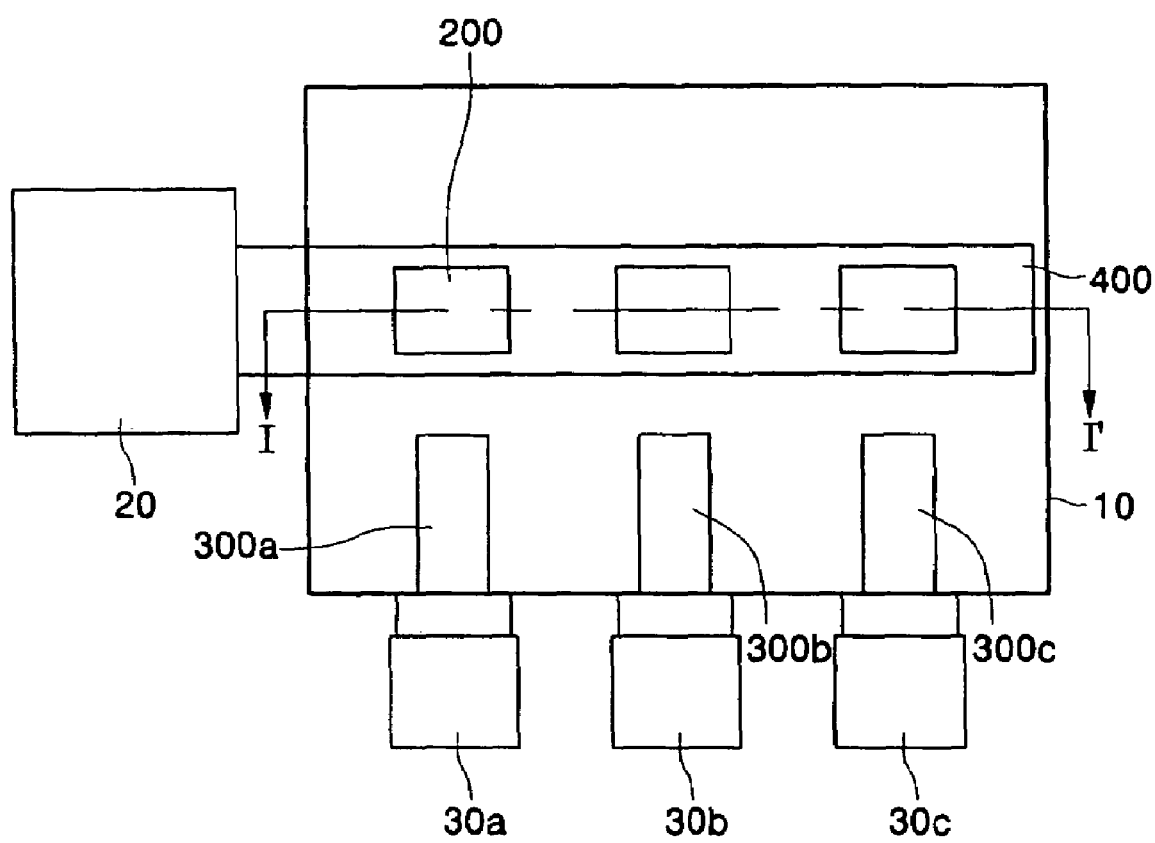
FIGS. 1A and 1B are cross-sectional views of an LITI apparatus in accordance with an embodiment of the present invention.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout the specification.

Figure 1B:
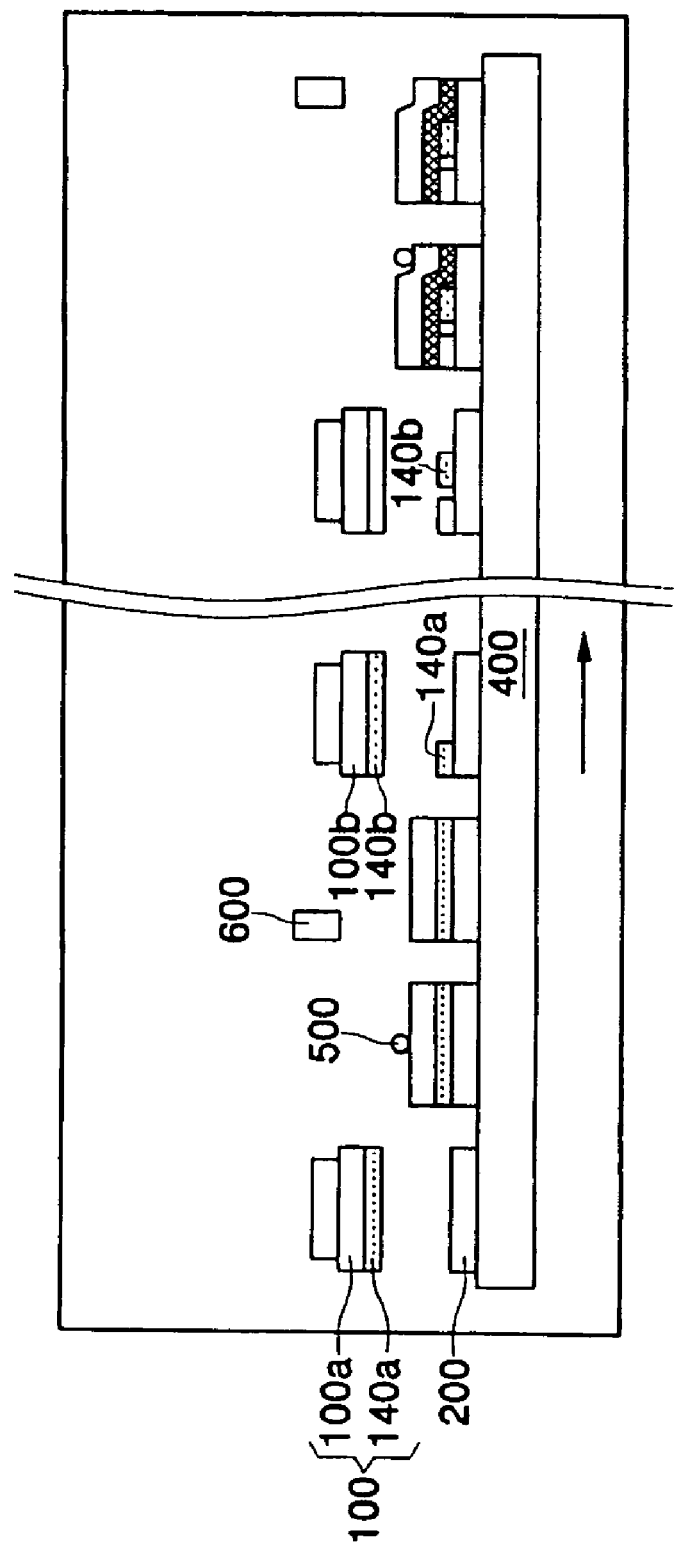

FIGS. 1A and 1B are cross-sectional views of an LITI apparatus in accordance with an embodiment of the present invention.

Referring to FIG. 1A, a stage 400 is present where a substrate 200 is positioned within a chamber 10, and transport devices 300a, 300b, and 300c for transporting a donor substrate onto the substrate 200 are positioned. The substrate 200 is supplied from a device 20 which is connected to the chamber 10 to load a substrate. In addition, the donor substrate transport devices 300a, 300b, and 300c are connected to respective deposition devices 30a, 30b, and 30c of forming transfer layers in response to colors of red, green, and blue emission layers, and supply the donor substrate into the chamber 10.

FIG. 1B is a cross-sectional view taken along the line I-I' of FIG. 1A. Referring to FIG. 1B, a laminator 500 for laminating the substrate 200 to the donor substrate 100 used for the LITI, and a laser optical unit 600 for performing the LITI are positioned within the chamber 10. Pressing means of a gas press, a crown press, a roller and so forth may be employed for the laminator 500.

The chamber 10 where the stage 400, the laminator 500, and the laser optical unit 600 are positioned provides an atmospheric pressure of an inert gas.

The atmospheric pressure of the inert gas may contain a water vapor concentration of 10 ppm or less. Alternatively, the atmospheric pressure of the inert gas may contain an oxygen concentration of 10 ppm or less.

Accordingly, partial pressures of the oxygen and the water vapor are adjusted in the inert gas atmosphere, which prevents external gases from flowing into the chamber. In addition, the gas atmosphere within the chamber may be kept to protect the transfer layer, which then allows pixel electrodes and organic layers on the substrate to be protected during a patterning process, so that the lifetime of the organic layers including the emission layers may be improved.

Referring back to FIGS. 1A and 1B, the stage 400 onto which the substrate is transported, and the donor substrate transport device 300 are moved in vertical directions to each other. The transfer layer 140 in the donor substrate may be an emission layer.

The donor substrate transport devices are positioned to be discriminated from each other in response to colors of the emission layers.

In addition, the donor substrate transport devices are moved in the chamber 10 and the external deposition devices 30, 30b, and 30c, respectively. The deposition devices may be positioned to be discriminated from each other in response to red, green, and blue colors of the emission layers.

Referring to FIG. 1B, the substrate 200 on the stage 400, for example, is moved in an x-direction within the chamber 10. The donor substrate 100a where the emission layer 140a is deposited in the deposition device 30a is loaded by the transfer device 300a, and the donor substrate 100a is moved onto the substrate 200. The substrate 200 and the donor substrate 100a are laminated on the stage 400, which are then subjected to the LITI process, and are moved in the x-direction. And a donor substrate 100b where an emission layer 140b is formed is moved to the substrate 200, wherein the emission layer 140b is formed in the deposition device 30b where an emission layer having another color is formed, and the processes are repeatedly performed to pattern the red, green, and blue emission layers.

Figure 2:
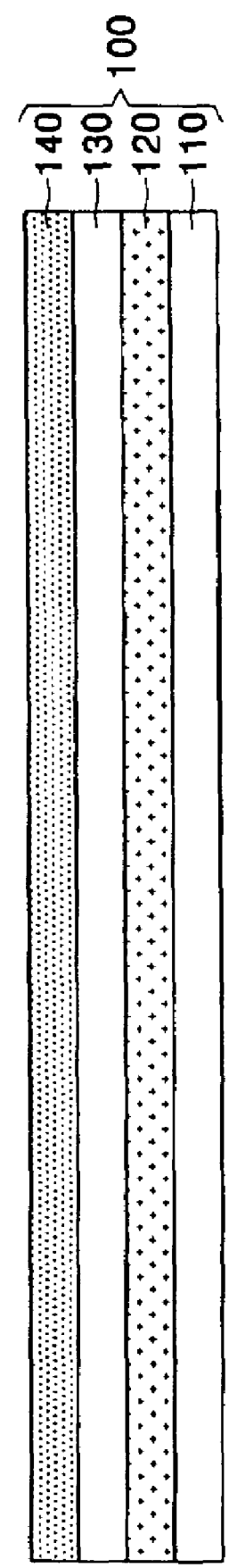
FIG. 2 is a cross-sectional view of a donor substrate of FIG. 1B.
Figure 3:
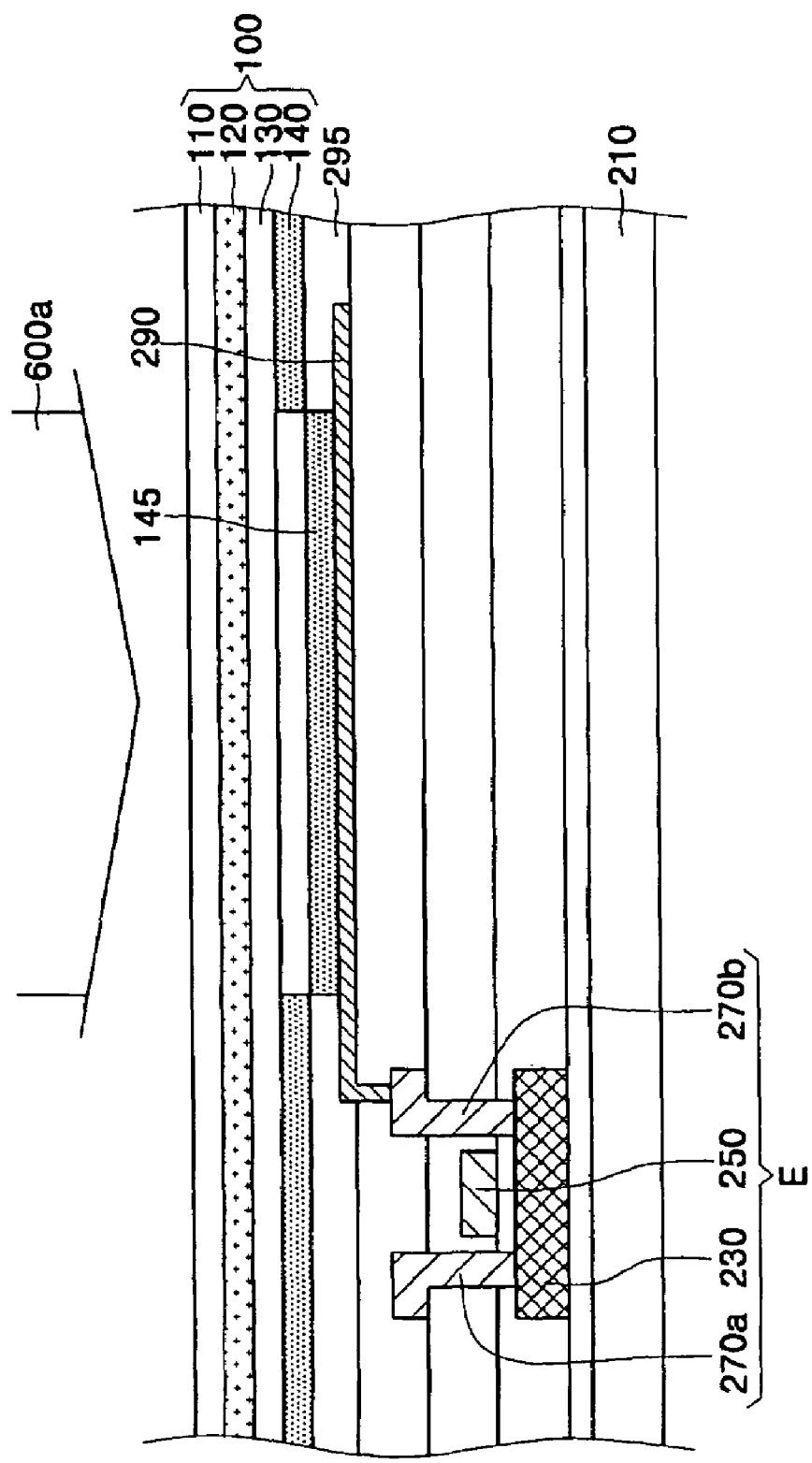
FIG. 3 is a cross-sectional view of a unit pixel illustrating the transfer procedure of FIG. 1B.

FIGS. 2 and 3 are cross-sectional views of a unit pixel in a process of fabricating an organic light emitting display using the above-described devices.

FIG. 2 is a cross-sectional view of a donor substrate, which shows the donor substrate 100 of FIG. 1B in detail.

Referring to FIG. 2, the donor substrate 100 is made of a plurality of layers formed on a base substrate 110, and has the base substrate 110, a light-to-heat conversion layer 120 positioned on the base substrate 110, and a transfer layer 140 positioned on the light-to-heat conversion layer.

The base substrate 110 may be one which has been subjected to framing, and may be formed of a flexible material or a hard material. It may be difficult to handle the base substrate 100 when it is too thin and may cause a problem of transporting the heavy donor substrate when it is too thick, so that the thickness of the base substrate 110 is preferably in a range of 20 µm to 200 µm.

The light-to-heat conversion layer 120 is formed on the base substrate, and a transfer layer 140 is formed on the light-to-heat conversion layer 120.

The light-to-heat conversion layer 120 acts to convert laser irradiated from a laser irradiation device into thermal energy, which acts to transfer the transfer layer onto a lower substrate being a receptor by changing an adhesion between the transfer layer 140 and the light-to-heat conversion layer 120.

In order to prevent the loss of the transfer material and to effectively adjust an adhesion between the transfer layer 140 and the donor substrate, a buffer layer 130 may be interposed between the light-to-heat conversion layer 120 and the transfer layer 140.

The transfer layer 140 may be an emission layer of an organic light emitting device. Alternatively, the transfer layer 140 may be formed of a material which further includes any one selected from a group consisting of a hole injecting layer, a hole transport layer, a hole blocking layer, and an electron injection layer.

Alternatively, the transfer layer 140 may be a small molecular organic layer.

FIG. 3 is a cross-sectional view of a unit pixel illustrating an LITI process, which shows the transfer process of FIG. 1B.

Referring to FIG. 3, a laser 600a is irradiated onto desired regions to be patterned on the donor substrate 100 and the substrate 200 positioned on the stage 400 of FIGS. 1A and 1B.

To detail this, a thin film transistor E including a gate electrode 250, a source electrode 270a, and a drain electrode 270b is positioned on the substrate 210, and a pixel electrode layer 290 connected to the thin film transistor E and a pixel defining layer 295 exposing the pixel electrode layer 290 are also positioned.

The donor substrate 100 and the substrate 200 are laminated. By means of the lamination, the donor substrate 100 and the substrate 200 are fixed, which are then subjected to a pressing process, so that bubbles between the donor substrate 100 and the substrate 200 may be removed.

After lamination, the laser 600a generated from the laser optical unit 600 of FIG. 1B is irradiated onto the regions to be patterned.

After irradiation of the laser 600a, an adhesion between the transfer layer 145 and the pixel electrode 290 which are tightly adhered to each other in the region irradiated by the laser 600a becomes higher than that between the buffer layer 130 and the transfer layer 140, so that the transfer layer 145 in the region irradiated by the laser is delaminated from the buffer layer 130, and the transfer layer 145 is patterned on the pixel electrode 290. The patterned transfer layer 145 may be formed in a stripe shape or a delta shape in response to the shape of the unit pixel.

The above-described procedures are carried out in an environment where partial pressures of oxygen and vapor are adjusted in the inert gas atmosphere. Accordingly, the partial pressures of oxygen and vapor may be adjusted in the inactive vapor atmosphere, so that the pixel electrode and the organic layer on the substrate may be protected during the patterning process, which allows the lifetime of the organic layer including the emission layer to be improved.

After the patterning process, the donor film 100 is removed from the substrate 200.

The substrate is then unloaded from the chamber, and a counter electrode is formed on the patterned organic layer in another stage. The fabrication of the organic light emitting display is completed by encapsulation.

The LITI apparatus according to the present invention performs the transfer process by adjusting the partial pressures of oxygen and vapor in the inert gas atmosphere, so that the organic layer to be transferred and the pixel electrode on the substrate may be protected from external airs, thereby improving the lifetime characteristic of the organic light emitting display fabricated by the LITI method of the present invention.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. A laser induced thermal imaging (LITI) apparatus comprising:
   a stage where a substrate is positioned, and movable in a constant direction;
   a transport device for transporting a donor substrate;
   a laminator for laminating the substrate to the donor substrate;
   a laser optical unit for performing the LITI; and
   a chamber supplied with an atmospheric pressure of an inert gas in which the stage, the laminator, and the laser optical unit are positioned.

2. The LITI apparatus as recited in claim 1, wherein the atmospheric pressure of the inert gas contains a water vapor concentration of 10 ppm or less.

3. The LITI apparatus as recited in claim 1, wherein the atmospheric pressure of the inert gas contains an oxygen concentration of 10 ppm or less.

4. The LITI apparatus as recited in claim 1, wherein the stage where the substrate is transported and the donor substrate transport device are moved in directions different from each other.

5. The LITI apparatus as recited in claim 1, wherein the donor substrate includes a transfer layer being a small molecular organic layer.

6. The LITI apparatus as recited in claim 1, wherein the donor substrate includes a transfer layer being an emission layer.

7. The LITI apparatus as recited in claim 6, wherein the donor substrate transport device is positioned to be discriminated in response to a color of the emission layer.

8. The LITI apparatus as recited in claim 7, wherein each of the donor substrate transport devices is moved in a deposition device connected outside the LITI apparatus.

9. The LITI apparatus as recited in claim 8, wherein the deposition device is positioned to be discriminated in response to each of red (R), green (G), and blue (B) colors of the emission layer.

10. The LITI apparatus as recited in claim 1, wherein the laminator includes pressing means using a gas press, a crown press, or a roller.

11. A laser induced thermal imaging (LITI) apparatus comprising:
    a stage where a substrate is positioned, and movable in a constant direction;
    a transport device for transporting a donor substrate moving toward the stage in a direction different from that of the stage, and being positioned to be discriminated in response to each color of an emission layer;
    a laminator for laminating the substrate to the donor substrate used for the LITI; and a laser optical unit for performing the LITI.

12. The LITI apparatus as recited in claim 11, wherein the stage, the donor substrate transport device, and the laser optical unit are positioned within a chamber for supplying an atmospheric pressure of an inert gas.

13. The LITI apparatus as recited in claim 12, wherein the atmospheric pressure of the inert gas contains a water vapor concentration of 10 ppm or less.

14. The LITI apparatus as recited in claim 12, wherein the atmospheric pressure of the inert gas contains an oxygen concentration of 10 ppm or less.

15. The LITI apparatus as recited in claim 11, wherein the donor substrate transport device moves toward the stage in a direction vertical to the stage.

16. The LITI apparatus as recited in claim 11, wherein each of the donor substrate transport devices is moved in a deposition device connected outside the LITI apparatus.

17. The LITI apparatus as recited in claim 16, wherein the deposition device is positioned to be discriminated in response to each of red (R), green (G), and blue (B) colors of the emission layer.

* * * * *